United States Patent
Rupp et al.

(10) Patent No.: US 10,861,964 B2
(45) Date of Patent: Dec. 8, 2020

(54) SEMICONDUCTOR DEVICE WITH JUNCTION TERMINATION ZONE

(71) Applicant: Infineon Technologies AG, Neubiberg (DE)

(72) Inventors: Roland Rupp, Lauf (DE); Rudolf Elpelt, Erlangen (DE); Reinhold Schoerner, Grossenseebach (DE); Larissa Wehrhahn-Kilian, Erlangen (DE); Bernd Zippelius, Erlangen (DE)

(73) Assignee: Infineon Technologies AG, Neubiberg (DE)

( * ) Notice: Subject to any disclaimer, the term of this patent is extended or adjusted under 35 U.S.C. 154(b) by 0 days.

(21) Appl. No.: 16/171,605

(22) Filed: Oct. 26, 2018

(65) Prior Publication Data
US 2019/0131446 A1    May 2, 2019

(30) Foreign Application Priority Data
Oct. 27, 2017   (DE) ............ 10 2017 125 244

(51) Int. Cl.
*H01L 29/78*     (2006.01)
*H01L 29/66*     (2006.01)
(Continued)

(52) U.S. Cl.
CPC ........ *H01L 29/7811* (2013.01); *H01L 21/046* (2013.01); *H01L 21/0475* (2013.01);
(Continued)

(58) Field of Classification Search
CPC ... H01L 21/265; H01L 29/78; H01L 29/7811; H01L 21/046; H01L 21/3085;
(Continued)

(56) References Cited

U.S. PATENT DOCUMENTS

| 3,769,109 A | 10/1973 | MacRae et al. |
| 6,083,814 A * | 7/2000 | Nilsson ............... H01L 21/046 |
| | | 257/E21.057 |

(Continued)

FOREIGN PATENT DOCUMENTS

| DE | 69631664 T2 | 12/2004 |
| DE | 102011075350 A1 | 11/2012 |

(Continued)

OTHER PUBLICATIONS

Ebihara, Kohei, et al., "Designing and Fabrication of the VLD Edge Termination for 3.3 kV SiC SBD", Materials Science Forum vols. 778-780, 2014, pp. 791-794.

(Continued)

*Primary Examiner* — Fazli Erdem

(74) *Attorney, Agent, or Firm* — Murphy, Bilak & Homiller, PLLC

(57) ABSTRACT

A semiconductor device includes a drift zone formed in a semiconductor portion. In a transition section of the semiconductor portion a vertical extension of the semiconductor portion decreases from a first vertical extension to a second vertical extension. A junction termination zone of a conductivity type complementary to a conductivity type of the drift zone is formed between a first surface of the semiconductor portion and the drift zone and includes a tapering portion in the transition section. In the tapering portion a vertical extension of the junction termination zone decreases from a maximum vertical extension to zero within a lateral width of at least twice the maximum vertical extension.

16 Claims, 14 Drawing Sheets

(51) Int. Cl.

| | |
|---|---|
| *H01L 29/06* | (2006.01) |
| *H01L 29/16* | (2006.01) |
| *H01L 29/861* | (2006.01) |
| *H01L 29/10* | (2006.01) |
| *H01L 21/308* | (2006.01) |
| *H01L 21/04* | (2006.01) |
| *H01L 29/417* | (2006.01) |
| *H01L 29/739* | (2006.01) |
| *H01L 29/808* | (2006.01) |

(52) U.S. Cl.
CPC ...... *H01L 21/3081* (2013.01); *H01L 21/3085* (2013.01); *H01L 21/3086* (2013.01); *H01L 29/0619* (2013.01); *H01L 29/0661* (2013.01); *H01L 29/1095* (2013.01); *H01L 29/1608* (2013.01); *H01L 29/41741* (2013.01); *H01L 29/6606* (2013.01); *H01L 29/66068* (2013.01); *H01L 29/66712* (2013.01); *H01L 29/7395* (2013.01); *H01L 29/8083* (2013.01); *H01L 29/8613* (2013.01)

(58) Field of Classification Search
CPC ..... H01L 29/1095; H01L 29/66; H01L 29/06; H01L 29/0639; H01L 29/1608; H01L 29/66068
See application file for complete search history.

(56) References Cited

U.S. PATENT DOCUMENTS

| | | | |
|---|---|---|---|
| 7,541,660 B2 | 6/2009 | Schulze et al. | |
| 2010/0055882 A1* | 3/2010 | Imhoff | H01L 21/0465 438/481 |
| 2011/0084354 A1* | 4/2011 | Honda | H01L 29/0615 257/493 |
| 2016/0126308 A1* | 5/2016 | Radhakrishnan | H01L 29/0615 257/77 |
| 2016/0181415 A1 | 6/2016 | Masuda | |
| 2017/0103894 A1* | 4/2017 | Aichinger | H01L 21/3065 |
| 2019/0131447 A1* | 5/2019 | Elpelt | H01L 21/046 |

FOREIGN PATENT DOCUMENTS

| | | |
|---|---|---|
| DE | 102015114429 B4 | 5/2017 |
| EP | 0014516 B1 | 3/1983 |

OTHER PUBLICATIONS

Krippendorf, Florian, et al., "Energy filter for ion implantation", Tagungsband: Mikrosystemtechnik Kongress 2013, Aachen, DE, Oct. 2013.

Snook, M., et al., "Single photolithography/implantation 120-zone Junction Termination Extension for High-Voltage SiC Devices", Materials Science Forum vols. 717-720, 2012, pp. 977-980.

Sung, Woongje, et al., "Area-Efficient Bevel-Edge Termination Techniques for SiC High-Voltage Devices", IEEE Transactions on Electron Devices, vol. 63, Issue 4, Apr. 2016, pp. 1-7.

* cited by examiner

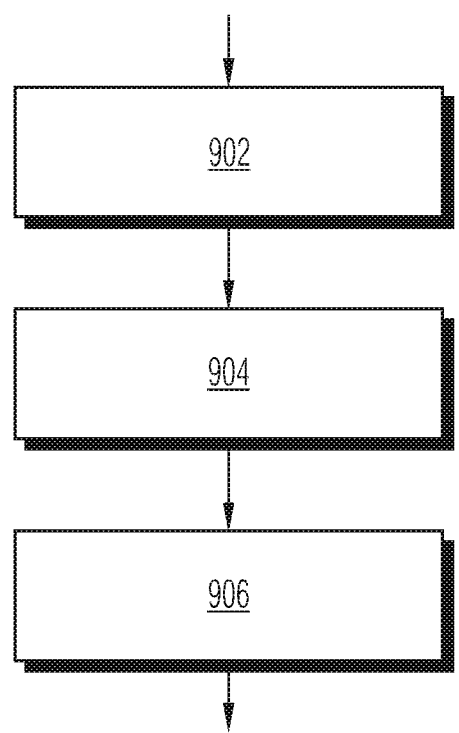

US 10,861,964 B2

SEMICONDUCTOR DEVICE WITH JUNCTION TERMINATION ZONE

BACKGROUND

Vertical power semiconductor devices control a load current flow between a first load electrode at a front side and a second load electrode on a back of a semiconductor die. In the off state, a blocking voltage drops vertically between the first load electrode at the front side and the second load electrode on the back and drops laterally across a termination area between an active area in a central region of the device and a doped edge region that is formed along the lateral surface of the semiconductor die and that has the electric potential of the second load electrode. Typically, a junction termination extension forming a pn junction with a drift zone shapes the lateral electric field in the termination region in a way that avoids high electric field strength along the front side of the semiconductor die.

There is a need for junction termination extensions that avoid high electric field strength inter alia in semiconductor materials with low diffusion coefficients for dopant ions. There is also a need for methods for forming such junction termination extensions.

SUMMARY

The present disclosure relates to a semiconductor device including a drift zone formed in a semiconductor portion that includes a transition section in which a vertical extension of the semiconductor portion decreases from a first vertical extension to a second vertical extension. A junction termination zone of a conductivity type complementary to a conductivity type of the drift zone is formed between a first surface of the semiconductor portion and the drift zone. The junction termination zone includes a tapering portion in the transition section. In the tapering portion a vertical extension of the junction termination zone decreases from a maximum vertical extension to zero within a lateral width of at least twice the maximum vertical extension.

The present disclosure also relates to a semiconductor device including a drift zone, which is formed in a semiconductor portion. The semiconductor portion includes a central area with a first vertical extension and a termination area. The termination area includes an edge section with a second vertical extension and a transition section in which the vertical extension gradually decreases from the first vertical extension to the second vertical extension. A junction termination zone between a first surface of the semiconductor portion and the drift zone has a conductivity type complementary to a conductivity type of the drift zone and includes a tapering portion in the transition section.

The present disclosure further relates to a method of manufacturing semiconductor devices. In a semiconductor substrate a doped region of uniform vertical extension is formed at least in a portion of a termination area of a device region, wherein the termination area surrounds a central area of the device region. An etch mask is formed on a substrate surface of the semiconductor substrate. The etch mask includes an etch mask opening that exposes an edge section of the termination area and that includes a tapering section in a transition section between the central area and the edge section. The semiconductor substrate is recessed by using a directional etch process to form, from the doped region, a junction termination zone that includes a tapering portion defined by the tapering section of the etch mask.

Further embodiments are described in the dependent claims. Those skilled in the art will recognize additional features and advantages upon reading the following detailed description and on viewing the accompanying drawings.

BRIEF DESCRIPTION OF THE DRAWINGS

The accompanying drawings are included to provide a further understanding of the present embodiments and are incorporated in and constitute a part of this specification. The drawings illustrate the present embodiments and together with the description serve to explain principles of the embodiments. Further embodiments and intended advantages will be readily appreciated as they become better understood by reference to the following detailed description.

FIG. 11 is a simplified flowchart illustrating a method of forming a tapering junction termination zone for a vertical power semiconductor device according to an embodiment.

DETAILED DESCRIPTION

In the following detailed description, reference is made to the accompanying drawings, which form a part hereof and in which are shown by way of illustrations of specific embodiments. It is to be understood that other embodiments may be utilized and structural or logical changes may be made without departing from the scope of the present disclosure. For example, features illustrated or described for one embodiment can be used on or in conjunction with other embodiments to yield yet a further embodiment. It is intended that the present disclosure includes such modifications and variations. The examples are described using specific language, which should not be construed as limiting the scope of the appending claims. The drawings are not scaled and are for illustrative purposes only. Corresponding elements are designated by the same reference signs in the different drawings if not stated otherwise.

The terms "having", "containing", "including", "comprising" and the like are open, and the terms indicate the presence of stated structures, elements or features but do not preclude additional elements or features. The articles "a", "an" and "the" are intended to include the plural as well as the singular, unless the context clearly indicates otherwise.

The term "electrically connected" describes a permanent low-resistive connection between electrically connected elements, for example a direct contact between the concerned elements or a low-resistive connection via a metal and/or heavily doped semiconductor material. The term "electrically coupled" includes that one or more intervening element(s) adapted for signal transmission may be between the electrically coupled elements, for example, elements that are controllable to temporarily provide a low-resistive connection in a first state and a high-resistive electric decoupling in a second state.

The Figures illustrate relative doping concentrations by indicating "−" or "+" next to the doping type "n" or "p". For example, "n−" means a doping concentration which is lower than the doping concentration of an "n"-doping region while an "n+"-doping region has a higher doping concentration than an "n"-doping region. Doping regions of the same relative doping concentration do not necessarily have the same absolute doping concentration. For example, two different "n"-doping regions may have the same or different absolute doping concentrations.

Figure 1:
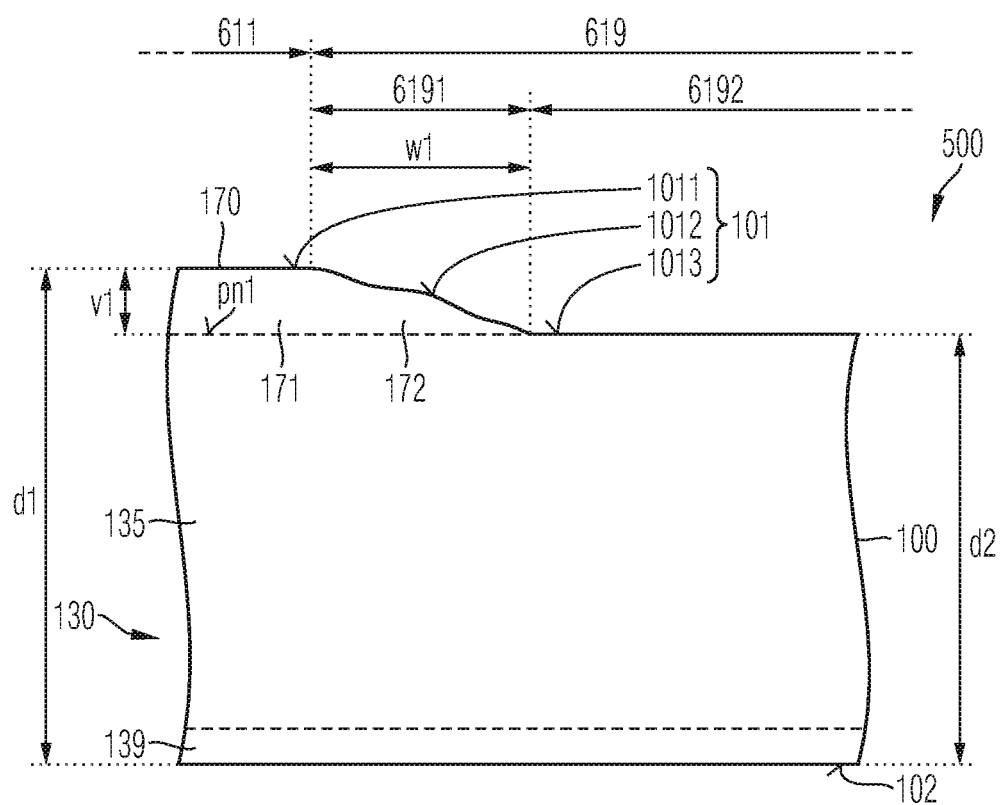
FIG. 1 is a schematic vertical cross-sectional view of a portion of a semiconductor device with a junction termination zone that includes a tapering portion in a tapering transition section of a semiconductor portion according to an embodiment.

FIG. 1 shows a portion of a semiconductor device 500 that may be or may include a power semiconductor diode, an MPS (merged pin Schottky) diode, an IGFET (insulated gate field effect transistor), for example, an MOSFET (metal oxide semiconductor FET) in the usual meaning including IGFETs with metal gates as well as IGFETs with gates from a semiconductor material, a JFET (junction field effect transistor), an IGBT (insulated gate bipolar transistor), or an MCD (MOS controlled diode), by way of example.

The semiconductor device 500 includes a semiconductor portion 100 with a first surface 101 at a front side and a second surface 102 on the back opposite to the first surface 101. In a central area 611 of the semiconductor portion 100 the first surface 101 includes a planar main surface 1011 at a first distance to the second surface 102. In an edge section 6192 of a termination area 619 that surrounds the central area 611, the first surface 101 includes a planar recessed surface 1013 at a smaller, second distance to the second surface 102.

A transition section 6191 of the termination area 619 between the central area 611 and the edge section 6192 of the first surface 101 includes a connection surface 1012 connecting the main surface 1011 and the recessed surface 1013, such that in the transition section 6191 a vertical extension of the semiconductor portion 100 gradually decreases from a first vertical extension d1 equal to the first distance to a second vertical extension d2 equal to the second distance.

The first vertical extension d1 between the main surface 1011 and the second surface 102 may be in a range of several μm to several hundred μm. The second vertical extension d2 is at most 2 μm smaller than the first vertical extension d1. A normal to the main surface 1011 defines a vertical direction and directions parallel to the main surface 1011 are horizontal directions which are also referred to as lateral directions in the following.

The semiconductor portion 100 may be based on a single-crystalline semiconductor material in which a diffusion coefficient for typical dopant atoms is significantly lower than for arsenic, boron and phosphorous atoms in single-crystalline silicon. According to an embodiment, the semiconductor portion is of silicon carbide (SiC) and includes a drift structure 130. The drift structure 130 includes a drift zone 135 of a first conductivity type, wherein the drift zone 135 may extend across a complete horizontal cross-sectional plane of the semiconductor portion 100 and accommodates the main portion of a blocking voltage applied between the first and second surfaces 101, 102. The drift structure 130 further includes a heavily doped base portion 139 between the drift zone 135 and the second surface 102.

A conductivity type of the base portion 139 may be the same as that of the drift zone 135, may be the complementary conductivity type or the base portion 139 may include doped zones of both conductivity types extending from the drift zone 135 to the second surface 102. Along the second surface 102 a dopant concentration of the base portion 139 may be sufficiently high to form a low-resistive contact, for example, an ohmic contact, with a metal structure that may directly adjoin the second surface 102.

A junction termination zone 170 between the first surface 101 and the drift structure 130, e.g., between the first surface 101 and the drift zone 135 forms a first pn junction pn1 with the drift zone 135.

The first pn junction pn1 may include horizontal sections parallel to the main surface 1011 and vertical sections orthogonal to the main surface 1011. According to an embodiment the first pn junction pn1 may be completely planar and may extend in one single geometrical plane parallel to the main surface 1011. A maximum vertical extension v1 of the junction termination zone 170 may be equal to a difference Δd=d1−d2 between the first distance d1 and the second distance d2, may be smaller than Δd. The maximum thickness v1 may be in a range from 200 nm to 2 μm, for example in a range from 400 nm to 1000 nm.

A mean dopant concentration in the junction termination zone 170 may be uniform along the lateral direction. For example, a mean dopant concentration in the junction termination zone 170 may be in a range from 1E16 cm$^{-3}$ to 1E18 cm$^{-3}$, for example, in a range from 5E16 cm$^{-3}$ to 5E17 cm$^{-3}$. The vertical dopant profile of the junction termination zone 170 may be undulated with two or more local maxima and one or more local minima. Alternatively, the vertical dopant profile of the termination zone 170 may be box-shaped, i.e., approximately uniform and without undulation, wherein, for example, an ion beam used for the implant may pass an energy filter before reaching the substrate.

In the transition section 6191 the junction termination zone 170 includes a tapering portion 172 with a lateral width w1, wherein a vertical extension of the junction termination zone 170 and the vertical extension of the semiconductor portion 100 decrease in the same way and by the same amount. In other words, along the tapering portion 172 the vertical extension of the tapering portion 172 changes by the same amount as the vertical extension of the semiconductor portion 100.

In the tapering portion 172 the vertical extension of the junction termination zone 170 decreases from the maximum thickness v1 to zero, wherein a ratio w1:v1 of the lateral width w1 to the maximum vertical extension v1 is at least 2:1, for example, at least 3:1, at least 5:1, or at least 10:1. According to an embodiment the ratio w1:v1 is at least 20:1. The junction termination zone 170 may further include a non-tapering portion 171 with a thickness equal to the maximum thickness v1 and laterally adjoining the tapering portion 172.

A vertical cross-sectional line of the connection surface 1012 may be completely or partially crooked, curved, concavely or convexly bowed, and may include straight sections parallel to or tilted to the main surface 1011. According to an embodiment the vertical extension of the tapering portion 172 may decrease monotonically. For example, the vertical extension of the tapering portion 172 may decrease strictly monotonic, e.g., linearly.

As a result, a total amount of dopant ions in the junction termination zone 170 steadily decreases. The blocking voltage drops across a comparatively large distance of several micrometers and the maximum lateral electric field strength is low compared to junction termination extensions with a steep lateral termination.

Without tapering portion 172, in a semiconductor device based on a semiconductor material with low diffusion coefficients for dopant ions, the total amount of dopant ions in the junction termination zone 170 decreases abruptly, the blocking voltage drops across a short distance and the maximum electric field strength is high. In semiconductor devices based on semiconductor materials with high diffusion coefficients for dopant atoms, a thermally induced diffusion of the dopants can smooth pn junctions in a way that the pn junctions smoothly accommodate the blocking voltage across a comparatively large lateral distance such that the maximum electric field strength in the termination area is comparatively low.

Figure 2A:
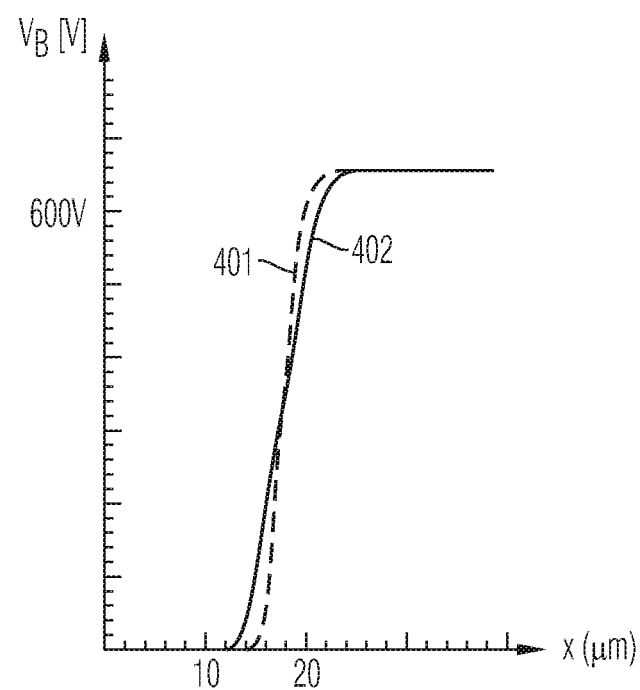
FIG. 2A is a schematic diagram illustrating blocking voltage distributions along a surface of semiconductor portions for discussing effects of the embodiments.

FIG. 2A shows the effect of a junction termination zone with a wedge-shaped tapering portion according to an embodiment related to a silicon carbide diode with a blocking capability of 650 V.

Line 401 plots the lateral potential along the first surface for a comparative example without tapering junction termination. Line 402 plots the lateral potential along the first surface 101 for an embodiment with a tapering junction termination having a lateral width w1 of 10 μm. The tapering portion significantly reduces steepness of the lateral potential.

Figure 2B:
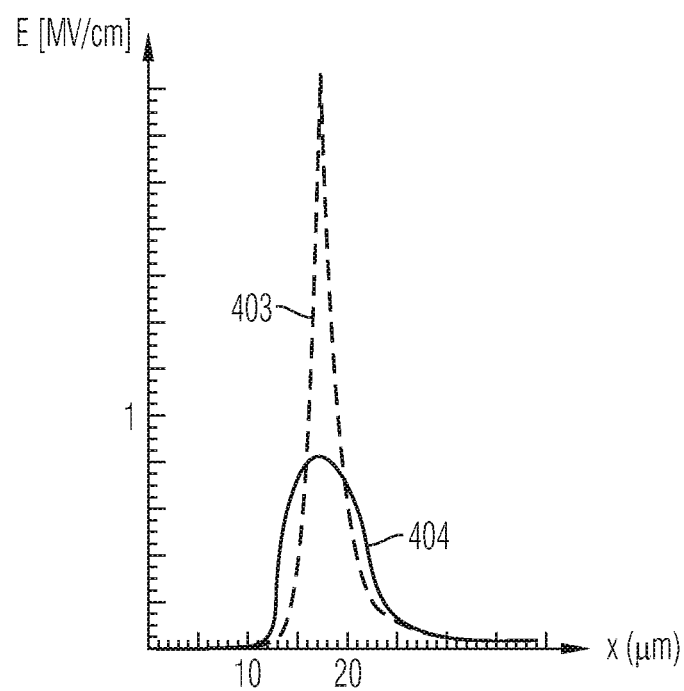
FIG. 2B is a schematic diagram illustrating electric field strength distributions along a surface of semiconductor portions for discussing effects of the embodiments.

FIG. 2B shows the lateral electric field strength along the first surface, wherein line 403 refers to the comparative example and line 404 refers to the embodiment with the tapering portion having a lateral width w1 of 10 μm. The maximum electric field strength is at most 30% of the maximum electric field strength in the comparative example.

Figure 3:
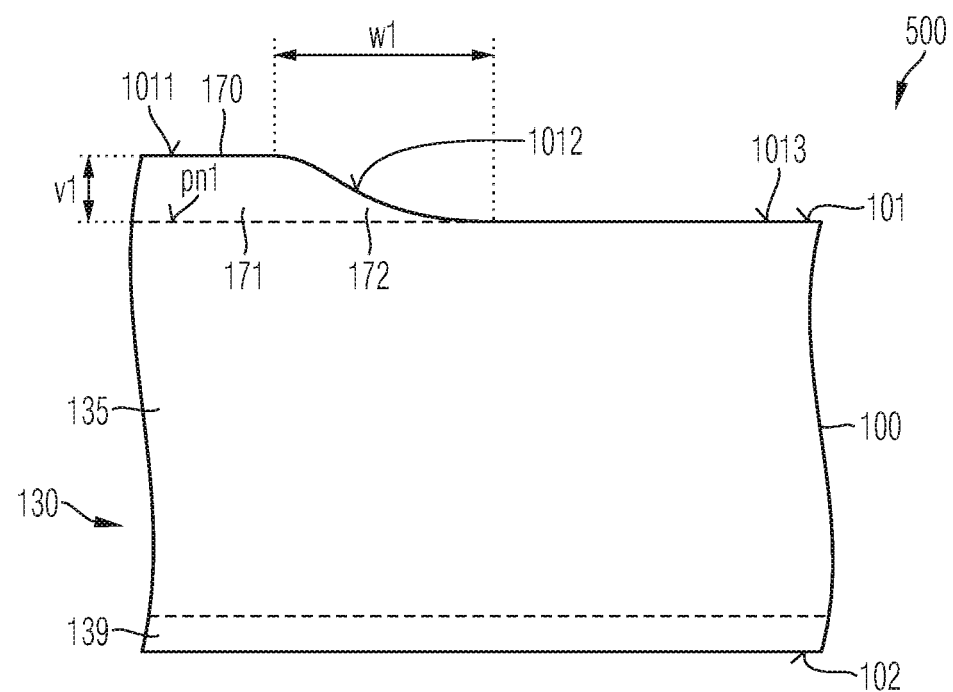
FIG. 3 is a schematic vertical cross-sectional view of a portion of a semiconductor device according to an embodiment related to a bowed tapering portion of a junction termination zone.

In FIG. 3 a vertical extension of the tapering portion 172 decreases strictly monotonic across the complete lateral tapering width w1 in a non-linear manner.

Figure 4:
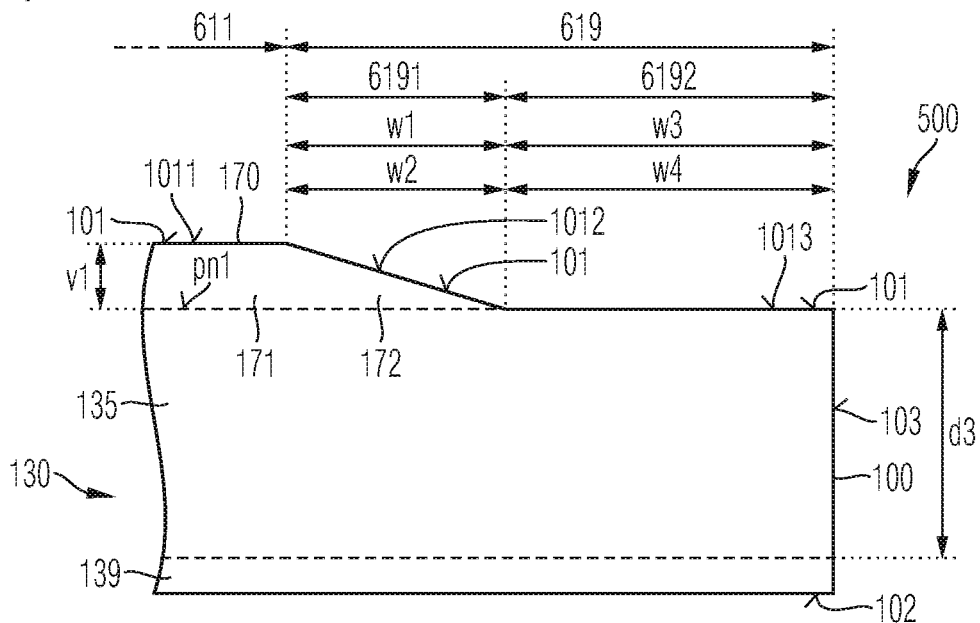
FIG. 4 is a schematic vertical cross-sectional view of a portion of a semiconductor device according to an embodiment related to linearly tapering junction termination zones.

FIG. 4 shows a wedge-shaped tapering portion 172 in which the vertical extension of the junction termination zone 170 linearly decreases from the maximum thickness v1 to zero.

A side surface 103 connects the first surface 101 and the second surface 102 and may be vertical with respect to the second surface 102. A lateral width w3 of the edge section 6192 is equal to a lateral distance w4 between the junction termination zone 170 and the side surface 103 and may be at least as large as a thickness d3 of the drift zone 135, or at least twice d3. For example, the lateral width w3 of the edge section 6192 may be at least 3 μm, for example, at least 4.5 μm for a silicon carbide device with a blocking voltage capability of 650 V and may be at least 8 μm, for example, at least 9.5 μm for a silicon carbide device with a blocking voltage capability of 1200 V. A lateral width w2 of the transition section 6191 is equal to a lateral width w1 of the tapering portion 172 of the junction termination zone 170.

Figure 5:
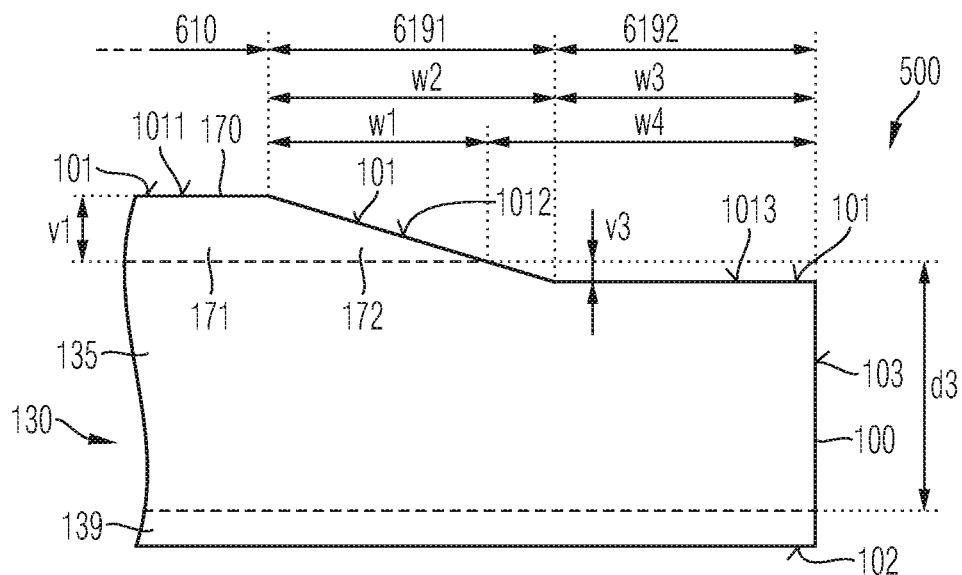
FIG. 5 is a schematic vertical cross-sectional view of a portion of a semiconductor device according to an embodiment combining a tapering junction termination zone with a recessed drift zone.

In FIG. 5 the difference Δd between the first distance d1 and the second distance d2 is greater than the maximum vertical extension v1 of the junction termination zone 170. A vertical recess v3 between the first pn junction pn1 and the recessed surface 1013 is at most equal to the maximal vertical extension v1 of the junction termination zone 170. A lateral width w2 of the transition section 6191 is greater than a lateral width w1 of the tapering portion 172 of the junction termination zone 170. The lateral distance w4 between the junction termination zone 170 and the side surface 103 may be at least the thickness d3 of the drift zone 135, or at least twice d3.

In the previous embodiments, the edge section 6192 of the semiconductor portion 100 between the junction termination zone 170 and the side surface 103 is devoid of further structures such as doped regions. According to other embodiments, the semiconductor portion 100 may include further doped regions, for example, one or more field rings between the junction termination zone 170 and the side surface 103.

Figure 6:
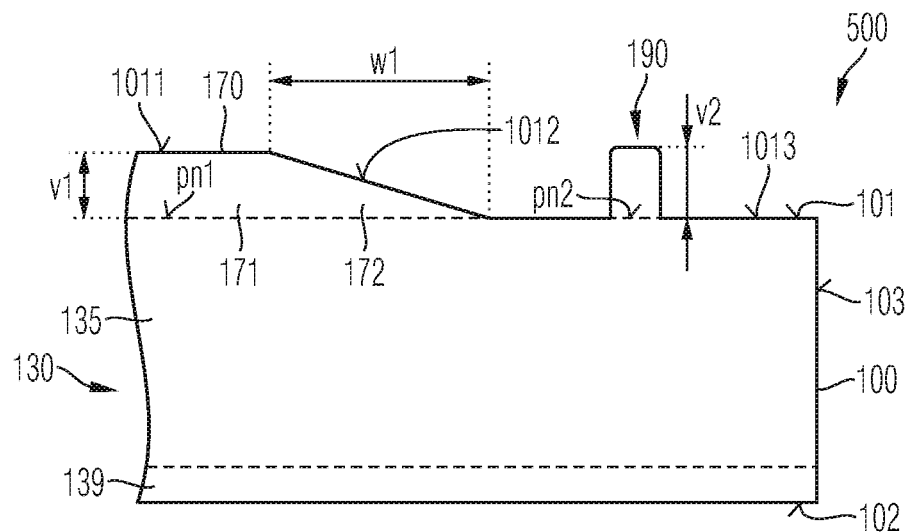
FIG. 6 is a schematic vertical cross-sectional view of a portion of a semiconductor device according to an embodiment combining a tapering junction termination zone with a field ring.

In FIG. 6 the edge section 6192 includes a field ring 190 that includes a doped field ring region 191 forming a second pn junction pn2 with the drift zone 135 in a section of the semiconductor portion 100 between the junction termination zone 170 and the side surface 103. The doped field ring region 191 may float. The field ring region 191 may protrude from the recessed surface 1013, wherein a vertical extension v2 of the field ring region 191 may be approximately the same as the maximum vertical extension v1 of the junction termination zone 170. A mean net dopant concentration in the field ring region 191 may be within the same order of magnitude as in the junction termination zone 170. According to an embodiment the mean net dopant concentration in the field ring region 191 may be the same as in the junction termination zone 170.

The second pn junction pn2 may be coplanar with at least an outer section of the first pn junction pn1. According to an embodiment, the second pn junction pn2 may be coplanar with the recessed surface 1013 as illustrated in FIG. 6.

Figure 7:
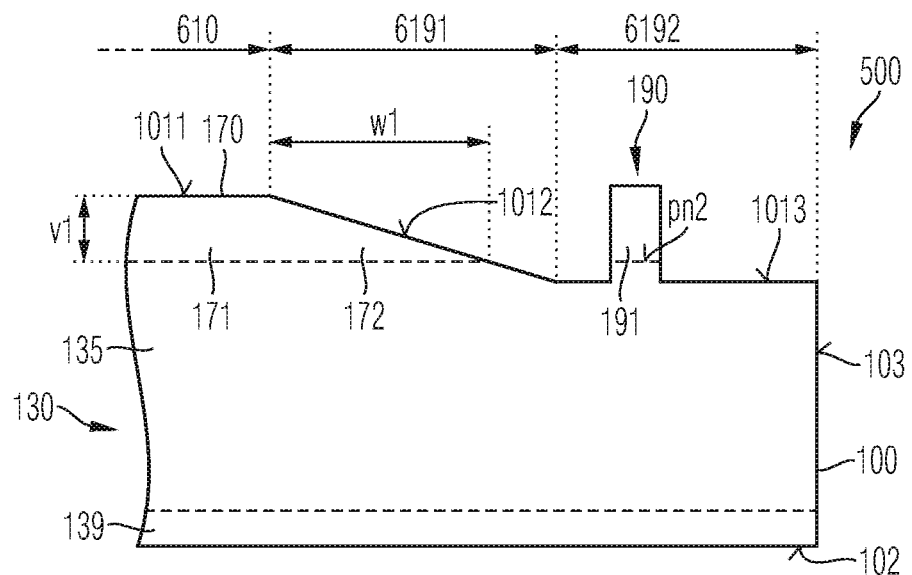
FIG. 7 is a schematic vertical cross-sectional view of a portion of a semiconductor device according to an embodiment combining a tapering junction termination zone with a field ring and with a recessed drift zone.

In the semiconductor device 500 of FIG. 7 the second pn junction pn2 is coplanar with the first pn junction pn1 and has a greater distance to the second surface 102 as the recessed surface 1013.

Figure 8A:
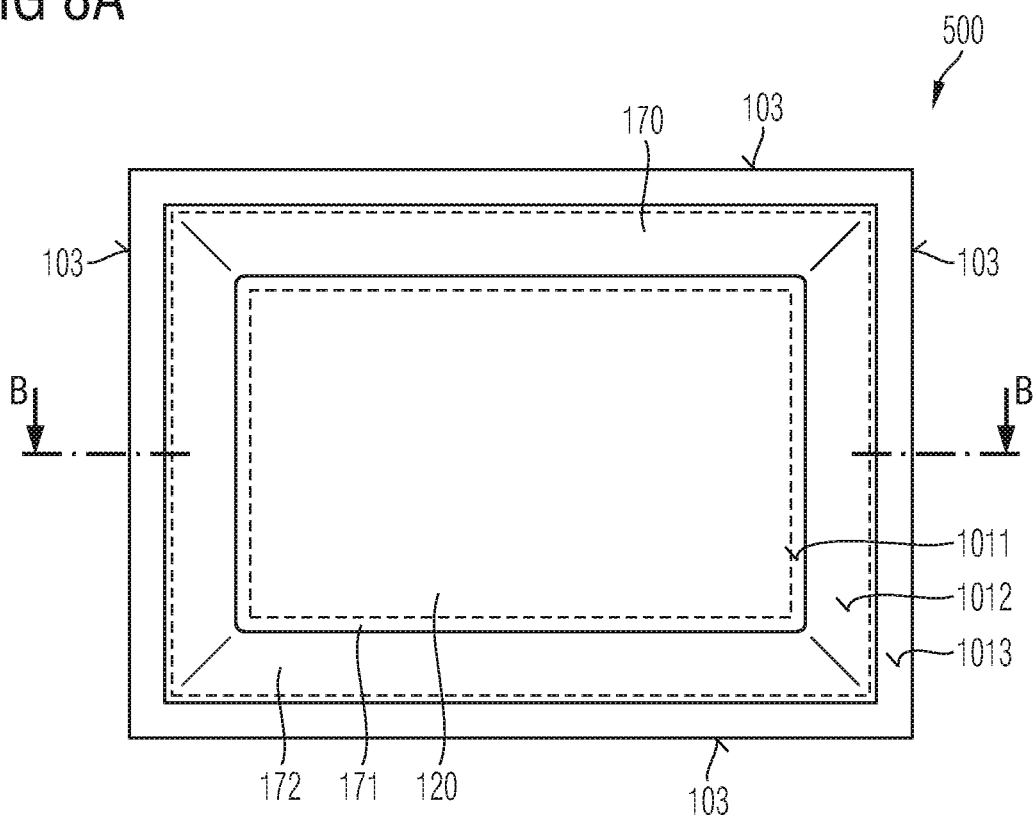
FIG. 8A is a schematic plan view of a semiconductor portion of a semiconductor device according to an embodiment combining a tapering junction termination zone with a central anode/base region.
Figure 8B:
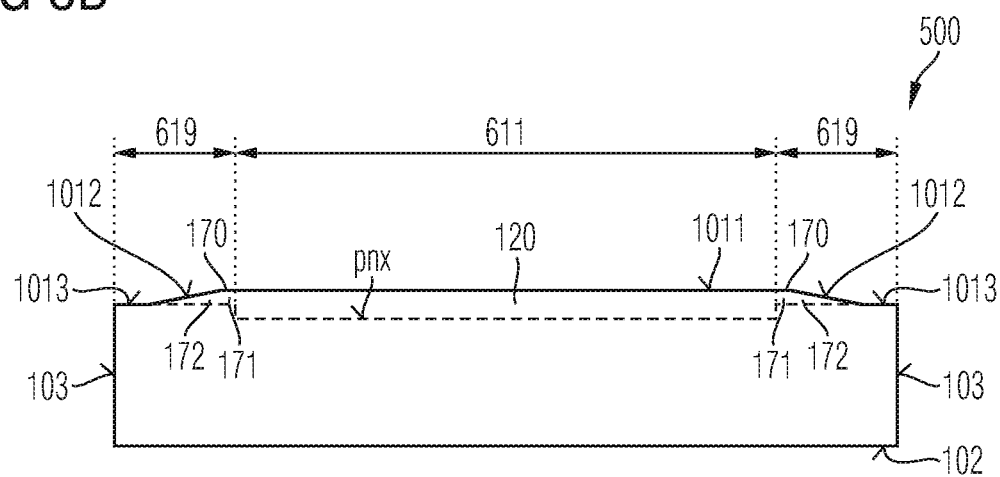
FIG. 8B is a schematic cross-sectional view of the semiconductor portion of FIG. 8A along line B-B.

FIGS. 8A and 8B show a semiconductor portion 100 of a semiconductor device 500 with a central area 611 and a termination area 619, wherein the termination area 619 surrounds the central area 611 and separates the central area 611 from a side surface 103.

The central area 611 includes an active area of the semiconductor device 500, wherein the active area may include an anode/body region 120 forming a main pn junction pnx with a drift structure 130 as described above. The anode/body region 120 may be an anode region of a power semiconductor diode, may include the anode zones of pn-diode cells of an MPS or may include body regions of transistor cells of a power semiconductor switch, e.g., an IGFET or an IGBT. In addition, the central area 611 may include interconnection structures, e.g., gate runners for electrically connecting gate electrodes of transistor cells in the central area 611.

The drift structure 130 includes a drift zone 135 between the anode/body region 120 at the front side and the second surface 102 on the back, wherein the anode/body region 120 forms the main pn junction pnx with the drift zone 135.

A junction termination zone 170 is laterally connected with the anode/body region 120 and may laterally surround the anode/body region 120 in the termination area 619. The junction termination zone 170 forms a first pn junction pn1 with the drift zone 135, wherein the first pn junction pn1 is parallel to the horizontal plane or includes sections parallel to the horizontal plane. The junction termination zone 170 includes a tapering portion 172 in which the vertical extension of the junction termination zone 170 decreases from a maximum vertical extension to a minimum vertical extension, which may be zero. The change of the vertical extension of the tapering portion 172 may correspond to a change of the vertical extension of the semiconductor portion 100 by the same amount.

The tapering portion 172 extends between a connection surface 1012 of the first surface 101 and the drift structure 130, wherein the connection surface 1012 is not parallel to the horizontal plane.

Figure 9:
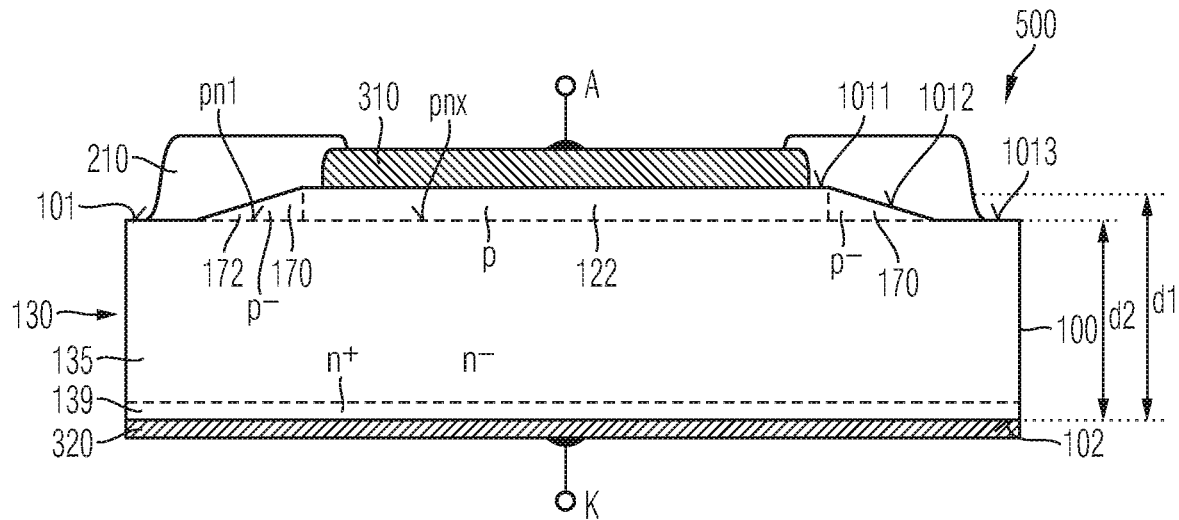
FIG. 9 is a schematic vertical cross-sectional view of a semiconductor device according to an embodiment related to a power semiconductor diode.
Figure 10:
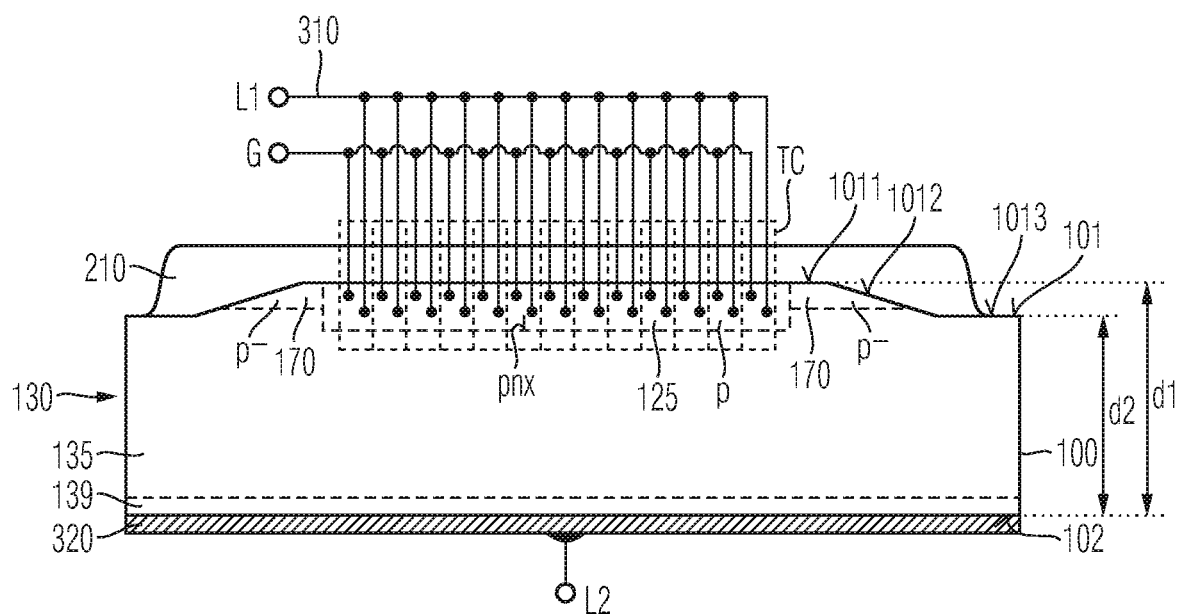
FIG. 10 is a schematic vertical cross-sectional view of a semiconductor device according to an embodiment related to a vertical power semiconductor switch.

FIGS. 9 and 10 refer to vertical cross-sections of semiconductor devices 500, wherein vertical cross-sections orthogonal to the illustrated cross-section may widely correspond to or may be qualitatively identical to the illustrated cross-sections.

In FIG. 9 the semiconductor device 500 is a power semiconductor diode with a semiconductor portion 100 of a single-crystalline semiconductor material in which a diffusion coefficient for typical dopant atoms is significantly lower than for arsenic, boron and phosphorous atoms in single-crystalline silicon, e.g., silicon carbide (SiC). For example, the semiconductor portion 100 may be based on 4H—SiC (SiC of the 4H-polytype), 2H—SiC, 6H—SiC or 15R—SiC. A first surface 101 of the semiconductor portion 100 at the front side includes a mainly planar main surface 1011 in a central area, a mainly planar recessed surface 1013 parallel to the main surface 1011 along a side surface 103 and a tilted connection surface 1012 connecting the main surface 1011 and the recessed surface 1013. On the back, an opposite second surface 102 is parallel to the main surface 1011 and to the recessed surface 1013.

A first vertical extension d1 of the semiconductor portion 100 between the main surface 1011 and the second surface 102 in a central area may be in a range of several μm to several hundred μm. A drift structure 130 directly adjoins the second surface 102. The drift structure 130 may include a lightly doped drift zone 135 as well as a heavily doped base portion 139 between the drift zone 135 and the second surface 102, wherein the base portion 139 has the same conductivity type as the drift zone 135.

The drift structure 130 may be electrically connected or coupled to a second load electrode 320 through a low-resistive contact. For example, a dopant concentration in the base portion 139 along the second surface 102 is sufficiently high to form a low-resistive ohmic contact with the second load electrode 320 that directly adjoins the second surface 102. The second load electrode 320 forms or is electrically connected or coupled to a cathode terminal K of the semiconductor diode.

A net dopant concentration in the drift zone 135 may be in a range from $1E14$ $cm^{-3}$ to $3E16$ $cm^{-3}$ in case the semiconductor portion 100 is based on silicon carbide. The drift structure 130 may include further doped regions between the drift zone 135 and the first surface 101 and between the drift zone 135 and the second surface 102.

In the central area an anode region 122 forms a main pn junction pnx with the drift structure 130, for example, with the drift zone 135. The main pn junction pnx may be parallel to the main surface 1011. A first load electrode 310 directly adjoins the anode region 122 and may form or may be electrically connected or coupled to an anode terminal A.

A transition section, in which the thickness of the semiconductor portion 100 gradually decreases from the first vertical extension d1 in the central area to a second vertical extension d2 along the side surface 103, includes a tapering portion 172 of a junction termination zone 170, wherein the vertical extension of the tapering portion 172 decreases in the same way and by the same amount as the vertical extension of the semiconductor portion 100. A mean net dopant concentration in the junction termination zone 170 may be lower than in the anode region 122.

A dielectric layer 210 may separate the tapering portion 172 or at least a section of the tapering portion 172 from the first load electrode 310. For example, the dielectric layer 210 may cover the tapering portion 172 or at least cover a section of the tapering portion 172 and may overlap on the first load electrode 310 and may overlap on the surface 1013.

FIG. 10 shows a semiconductor device 500 including transistor cells TC. The semiconductor device 500 may be, for example, an IGFET, a JFET, an IGBT or an MCD. Regarding details of the semiconductor portion 100, the drift structure 130 and the junction termination zone 170, reference is made to the description of the semiconductor diode in FIG. 9.

Instead of an anode region, the semiconductor device 500 of FIG. 10 includes transistor cells TC, wherein in each transistor cell TC a body region 125 separates a source region from the drift structure 130. The body regions 125 form first transistor pn junctions, which correspond to the main pn junctions pnx of FIG. 9, with the drift structure 130, e.g., with the drift zone 135. The body region 125 forms second transistor pn junctions with the source zones.

A first load electrode 310 electrically connected to the body regions 125 and the source regions of the transistor cells TC may form or may be electrically connected or coupled to a first load terminal L1, which may be an anode terminal of an MCD, a source terminal of an IGFET or JFET, or an emitter terminal of an IGBT.

A second load electrode 320 electrically connected to the base portion 139 may form or may be electrically connected or coupled to a second load terminal L2, which may be a cathode terminal of an MCD, a drain terminal of an IGFET or JFET, or a collector terminal of an IGBT.

The transistor cells TC may be transistor cells with planar gate electrodes or with trench gate electrodes, wherein the trench gate electrodes may control a lateral channel or a vertical channel. According to an embodiment, the transistor cells TC are n-channel IGFET cells of the enhancement type with p-doped body regions 125, n-doped source zones and an n-doped drift zone 135. Other embodiments may concern p-channel IGFET cells of the enhancement type, depletion-type IGFET cells, normally-on JFET cells, or normally-off JFET cells.

According to FIG. 11 a method of manufacturing a silicon carbide device with a junction termination extension includes forming a doped region of uniform vertical extension in a termination area of a device region of a semiconductor substrate of silicon carbide, wherein the termination area surrounds a central area of the device region (902). An etch mask is formed on a substrate surface of the semiconductor substrate (904), wherein the etch mask includes an etch mask opening exposing a portion of the termination area and wherein the etch mask includes tapering mask sections in which a thickness of the etch mask decreases from a maximum thickness to zero within a lateral distance of at least twice the maximum thickness.

The doped region is etched (906) in a directional etch process to form a junction termination zone including a tapering portion defined by the tapering section of the etch mask.

FIGS. 12A to 12E refer to an embodiment using gray scale lithography for forming an etch mask with tapering mask sections.

A doped region 770 of uniform vertical extension v1 is formed by introducing dopants into a semiconductor substrate 700, e.g., by ion implantation through a substrate surface 701. The semiconductor substrate 700 may be a silicon carbide substrate, e.g., of 4H—SiC or 6H—SiC and may include a base substrate 705, which may be a silicon carbide slice obtained from a silicon carbide ingot by sawing, by way of example. The base substrate 705 may be heavily doped, for example heavily n-doped. An epitaxy process may form a drift layer structure 730 on a process surface of the base substrate 705. The semiconductor substrate 700 may include further doped regions, for example, one or more p-doped regions laterally adjoining the doped region 770 and forming an anode region of a semiconductor diode or body regions of transistor cells.

Figure 12A:
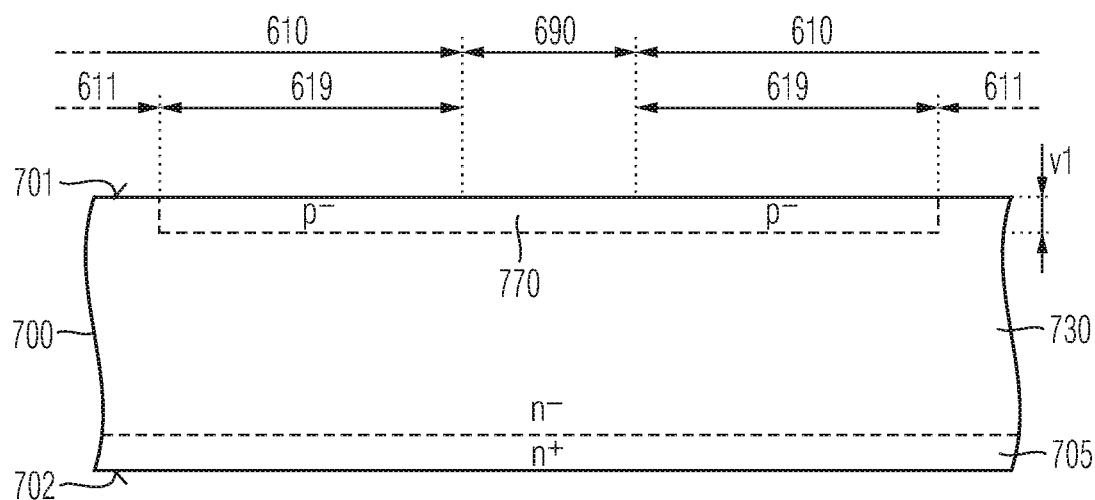
FIG. 12A is a schematic vertical cross-sectional view of a portion of a semiconductor substrate for illustrating a method of manufacturing semiconductor devices with lateral junction termination zones including tapering portions according to an embodiment based on gray scale lithography, after forming a doped region of uniform vertical extension in a termination area.

FIG. 12A shows the doped region 770 that may be formed exclusively in a termination area 619 of a device region 610 or that may extend into a kerf region 690 between neighboring device regions 610, wherein the device regions 610 correspond to kernels of semiconductor dies of single semiconductor devices obtained from the semiconductor substrate 700 at a later stage and wherein the termination areas 619 surround central areas 611 that include active device areas such as transistor cell arrays or anode regions.

A mean net dopant concentration in the doped region 770 may be constant along the lateral direction. The vertical extension v1 of the doped region 770 may be constant such that a pn junction between the doped region 770 and the drift layer structure 730 is planar and extends in a single geometric plane parallel to the substrate surface 701. According to other embodiments, forming the doped region 770 may include two or more implants with different vertical extensions, such that the first pn junction may include several planar sections in different distances to the substrate surface 701. An etch mask layer 410 may be deposited on the substrate surface 701.

Figure 12B:
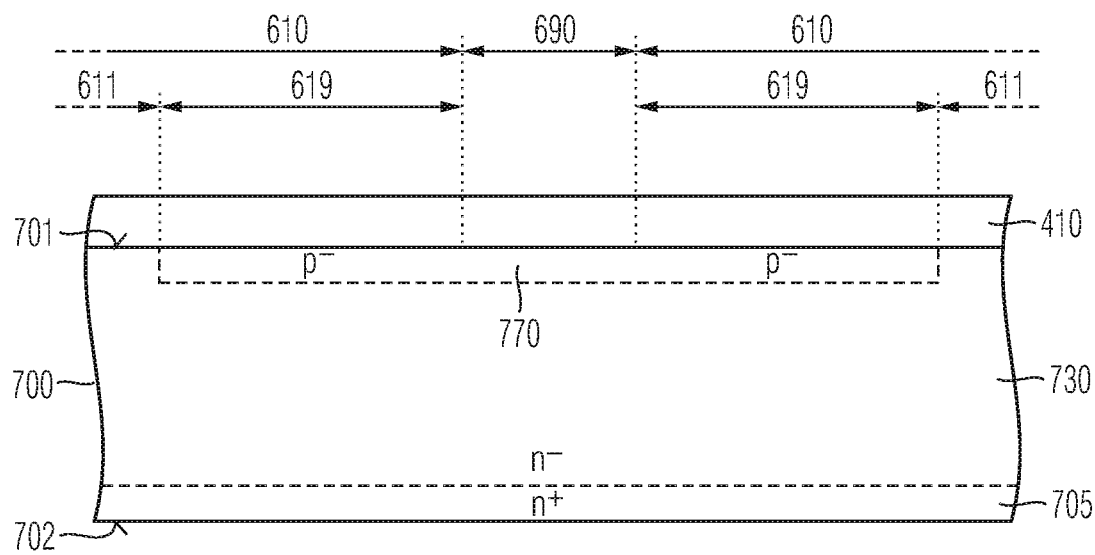
FIG. 12B is a schematic vertical cross-sectional view of the semiconductor substrate portion of FIG. 12A, after forming an etch mask layer.

FIG. 12B shows the etch mask layer 410, which may include one single layer or which may include a layer stack including sub layers of different materials. The etch mask layer 410 may include or consist of a layer of silicon oxide or silicate glass, for example, a layer of PSG (phosphorous silicate glass). According to other embodiments, the etch mask layer 410 includes silicon oxide formed by deposition of TEOS (tetraethylorthosilane).

A gray scale mask layer is deposited on the etch mask layer 410 and patterned by gray scale lithography to form a gray scale mask 421.

Figure 12C:
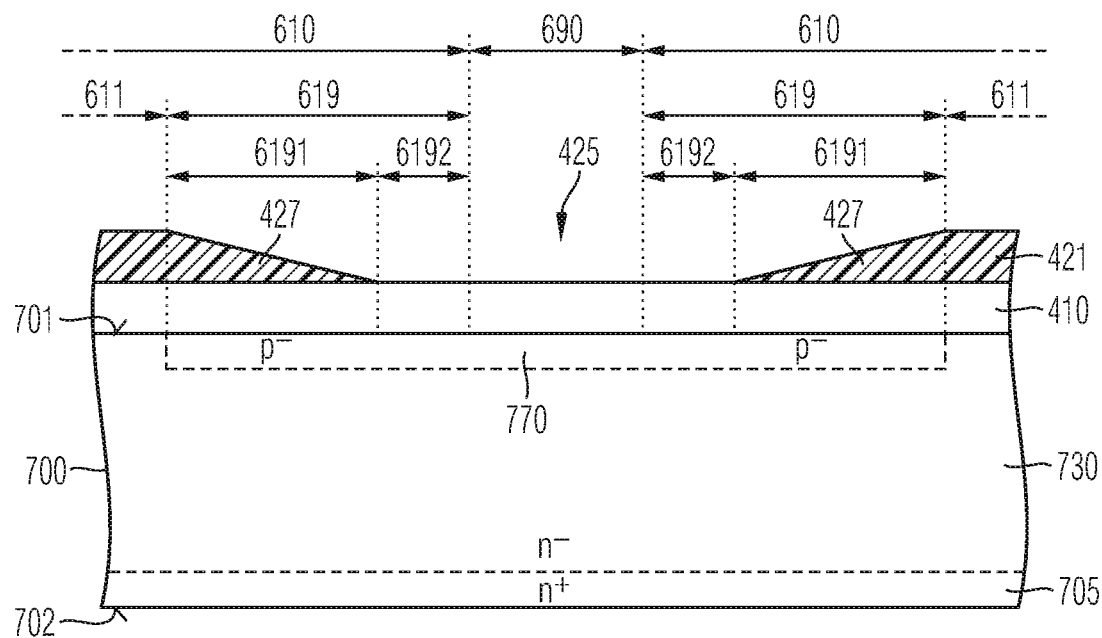
FIG. 12C is a schematic vertical cross-sectional view of the semiconductor substrate portion of FIG. 12B, after forming a gray scale mask with tapering sections by using gray scale lithography.

FIG. 12C shows the gray scale mask 421, which may include a photoresist material. The gray scale mask 421 may cover central areas 611 of the device regions 610 at uniform thickness. A gray scale mask opening 425 exposes a section of the etch mask layer 410 in the kerf region 690 and in portions of the device regions 610 directly adjoining the kerf region 690. In tapering sections 427 along the gray scale mask opening 425 the thickness of the gray scale mask 421 gradually decreases from a maximum thickness to zero.

Using the gray scale mask 421 as etch mask, the etch mask layer 410 is locally recessed by an etch process that consumes both the material of the etch mask layer 410 and the material of the gray scale mask 421. The recess rates for the etch mask layer 410 and the gray scale mask 421 may be selected such that the gray scale mask 421 is completely consumed shortly after the doped region 770 is exposed, wherein the tapering section 427 of the gray scale mask 421 is imaged into tapering mask sections 417 of an etch mask 411 formed from a remnant portion of the etch mask layer 410.

Figure 12D:
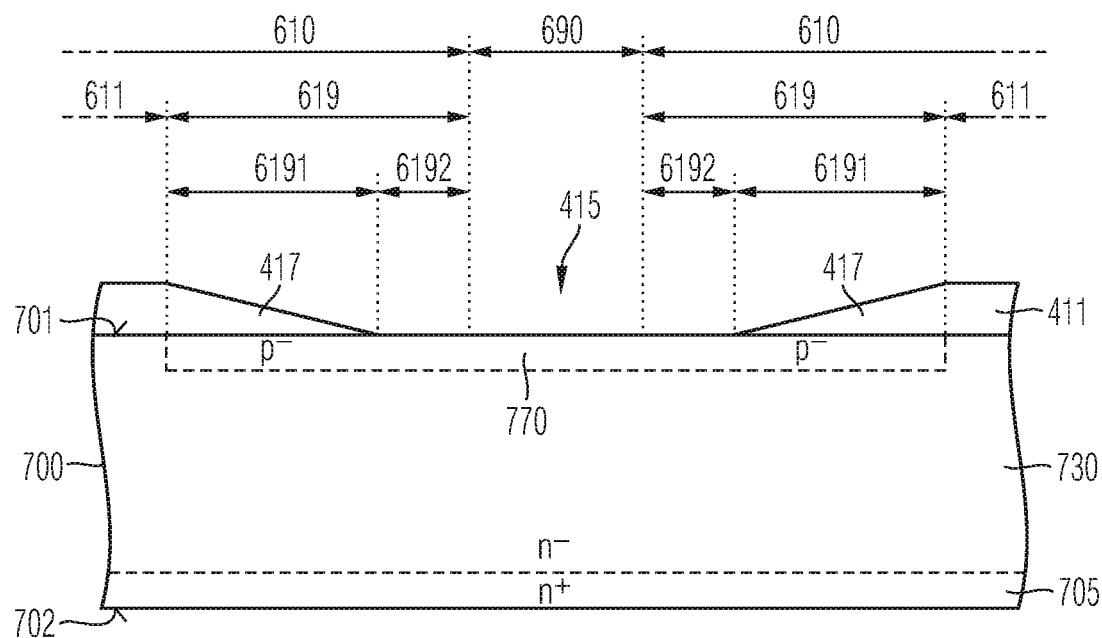
FIG. 12D is a schematic vertical cross-sectional view of the semiconductor substrate portion of FIG. 12C, after forming an etch mask with tapering sections.

FIG. 12D shows the etch mask 411 covering the central areas 611 at approximately uniform thickness and including an etch mask opening 415 exposing the doped region 770 in the kerf region 690 and in edge sections 6192 directly adjoining the kerf region 690. The tapering mask sections 417 cover inner transition sections 6191 of termination areas 619 directly adjoining the central areas 611.

A further etch process transfers the pattern of the etch mask 411 into the semiconductor substrate 700, wherein the etch process recesses both the etch mask 411 and the semiconductor substrate 700. The etch process is selected such that the etch mask 411 is completely removed shortly after the etching has reached the pn junction between the doped region 770 and the drift layer structure 730. The etch process may include a high physical portion. For example, the etch process may include ion beam milling.

Figure 12E:
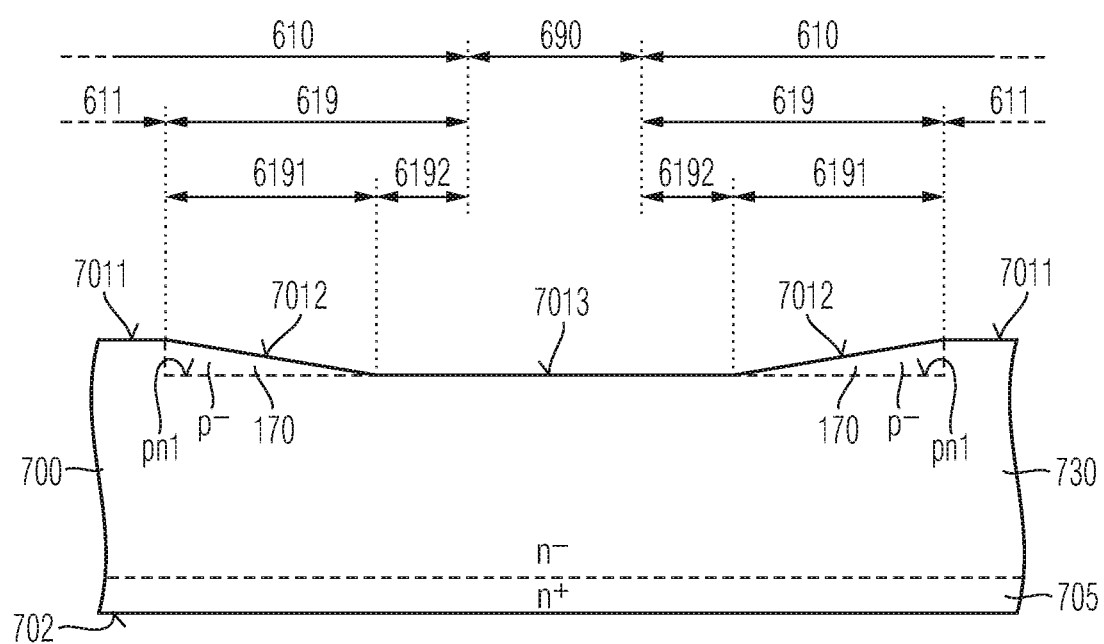
FIG. 12E is a schematic vertical cross-sectional view of the semiconductor substrate portion of FIG. 12D, after etching the doped region by using the etch mask of FIG. 12D.

FIG. 12E shows the recessed semiconductor substrate 700 with the doped region 770 as illustrated in FIG. 12D completely removed both in the kerf region 690 and in edge sections 6192 of the termination areas 619 directly adjoining the kerf region 690. Transition sections 6191 of the termination areas 619 include wedge-shaped junction termination zones 170 forming first pn junctions pn1 parallel to unrecessed sections 7011 of the substrate surface 701. The substrate surface 701 further includes recessed sections 7013 and connection sections 7012 connecting the unrecessed sections 7011 with the recessed sections 7013. Etching may stop at the plane of the pn junction or below the pn junction such that the tapering portion 172 of the junction termination zone 170 is narrower than the transition section 6191, in which the vertical extension of the semiconductor portion 100 decreases.

The process gets along without an implantation process using a photoresist material as implant mask with tapering sections and avoids formation of implant-induced resist residuals, the removal of which may be a complex task, because the implantation process may convert thin sections of a photoresist layer in residuals, which are typically hard to remove.

According to another embodiment, deposition and patterning of the etch mask layer 410 are omitted and the gray scale mask 421 is directly formed on the substrate surface 701.

Figure 13A:
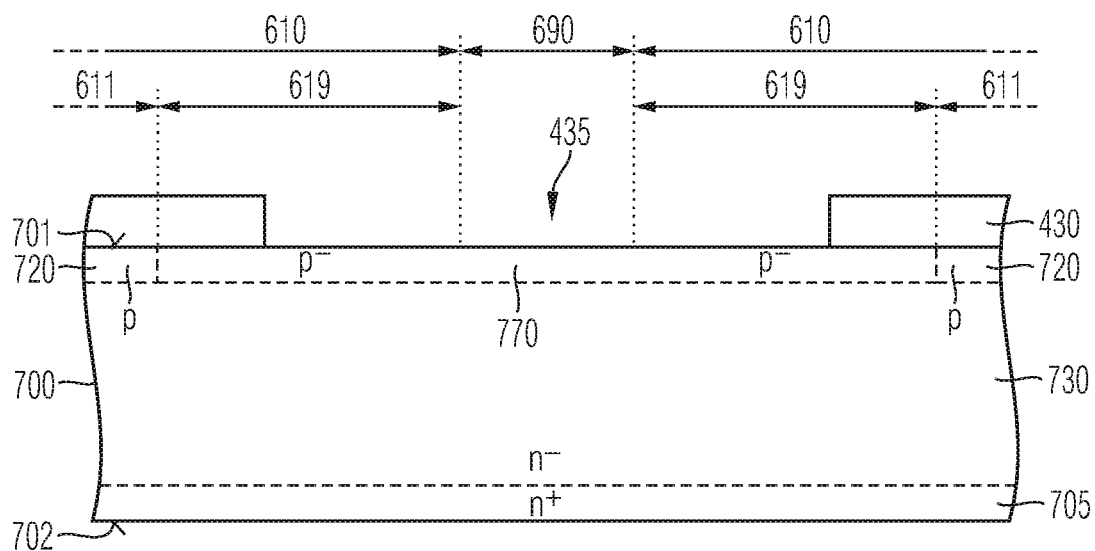
FIG. 13A is a schematic vertical cross-sectional view of a portion of a semiconductor substrate for illustrating a method of manufacturing semiconductor devices with junction termination zones including tapering portions according to an embodiment based on a reflow of a precursor mask, after forming the precursor mask.
Figure 13B:
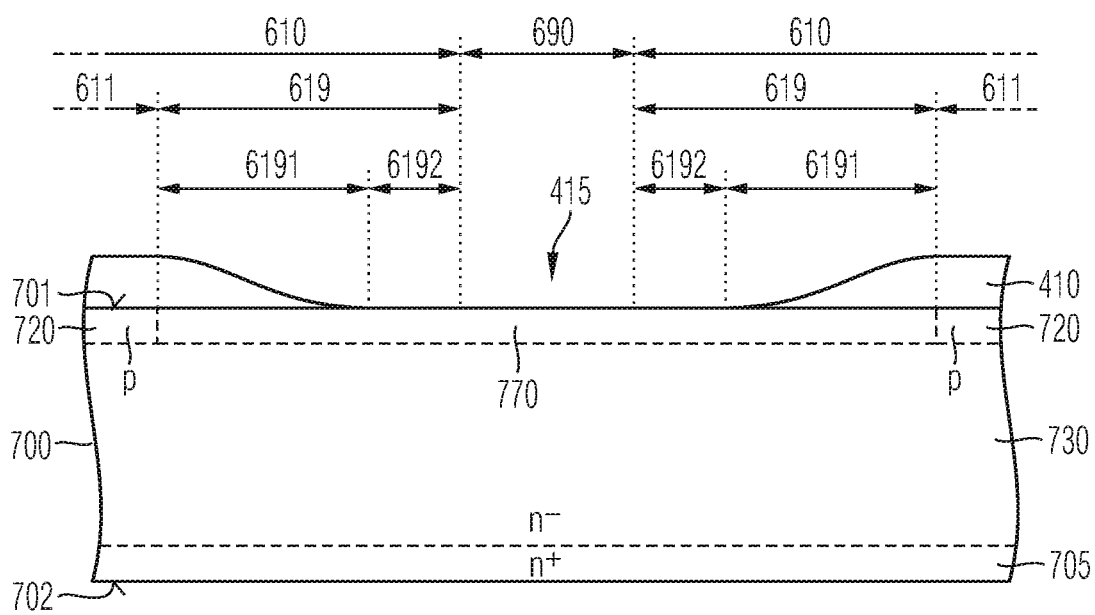
FIG. 13B is a schematic vertical cross-sectional view of the semiconductor substrate portion of FIG. 13A, after a heat treatment for a reflow of the precursor mask.
Figure 13C:
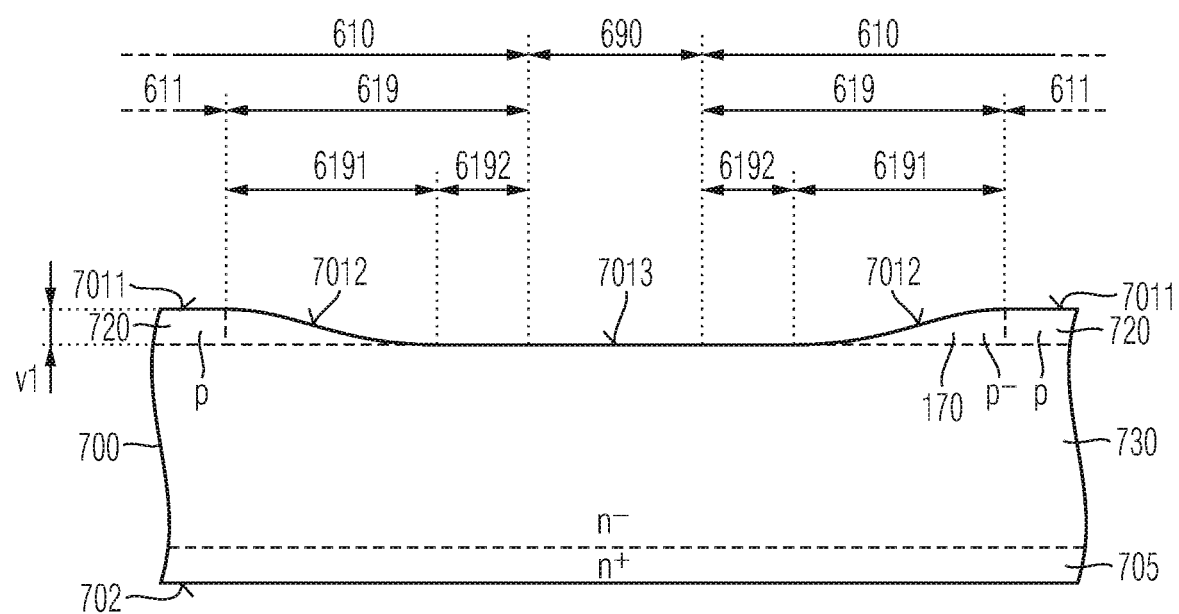
FIG. 13C is a schematic vertical cross-sectional view of the semiconductor substrate portion of FIG. 13B, after recessing a doped layer by using the etch mask of FIG. 13B.

FIGS. 13A to 13C illustrate a method of forming an etch mask with tapering portions on the basis of a reflow process. As regards formation of a doped region 770 in a semiconductor substrate 700 reference is made to the description of FIG. 12A.

A precursor mask layer is deposited on the substrate surface 701 and patterned by photolithography to form a precursor mask 431 covering the central areas 611 of the device regions 610 and including precursor mask openings 435 exposing sections of a substrate surface 701 in a kerf region 690 and in outer sections of the termination areas 619 directly adjoining the kerf region 690.

FIG. 13A shows the precursor mask 431 including a precursor mask opening 435 with vertical sidewalls within the termination areas 619. The precursor mask 431 covers central areas 611 of the device regions 610 and exposes both the kerf region 690 and outer sections of the termination areas 619 directly adjoining the kerf region 690. The precursor mask 431 may include a material with well-defined reflow properties at comparatively low temperatures, e.g., below 800° C. such as doped silicate glass, e.g., PSG, BSG (boron silicate glass), BPSG (boron phosphorous silicate glass), or FSG (fluorine silicate glass).

The semiconductor substrate 700 is subjected to a heat treatment at a temperature at which the precursor mask 431 starts to reflow and the steep sidewalls of the precursor mask opening 435 start to degrade. The heat treatment is terminated, when a region in which the thickness of the precursor mask material is not uniform, reaches a target width corresponding to a target width of the transition sections 6191.

FIG. 13B shows an etch mask 411 formed by reflow of the precursor mask 431 of FIG. 13A. The etch mask 411 includes etch mask openings 415 exposing edge sections 6192 of the termination area 619 as well as the kerf region 690. A suitable etch process images the contour of the etch mask 411 into the semiconductor substrate 700 as described with respect to FIG. 12E.

FIG. 13C shows the semiconductor substrate 700 after removal of the etch mask 411 of FIG. 13B. The substrate surface 701 includes unrecessed sections 7011 in the central areas 611, a recessed section 7013 in both the kerf region 690 and the edge sections 6192 of the termination areas 619. In the transition sections 6191 of the termination areas 619, curved connection sections 7012 of the substrate surface 701 connect the unrecessed sections 7011 with the recessed section 7013.

The etch process forms, from the doped region 770 of FIG. 13B, separated junction termination zones 170 laterally spaced from one another. Directly below the connection section 7012 a vertical extension of the junction termination zones 170 decreases from a maximum vertical extension v1 to zero.

Figure 14A:
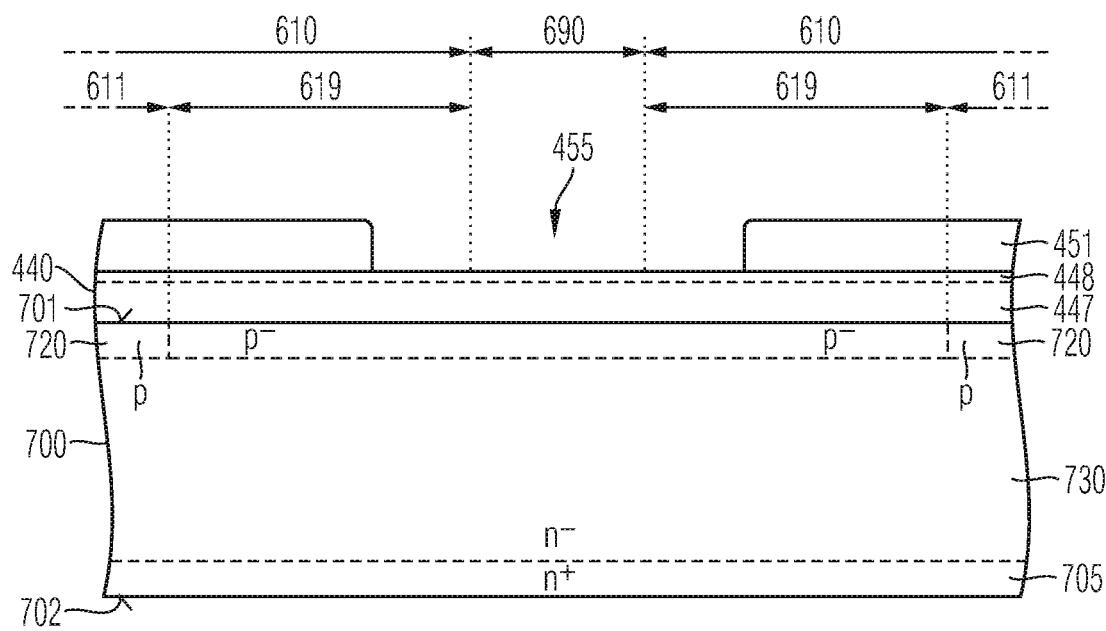
FIG. 14A is a schematic vertical cross-sectional view of a portion of a semiconductor substrate for illustrating a method of manufacturing semiconductor devices with junction termination zones including tapering portions according to an embodiment based on a multi-layer etch mask in combination with isotropic etching, after forming a support mask on a multi-layer mask stack.
Figure 14B:
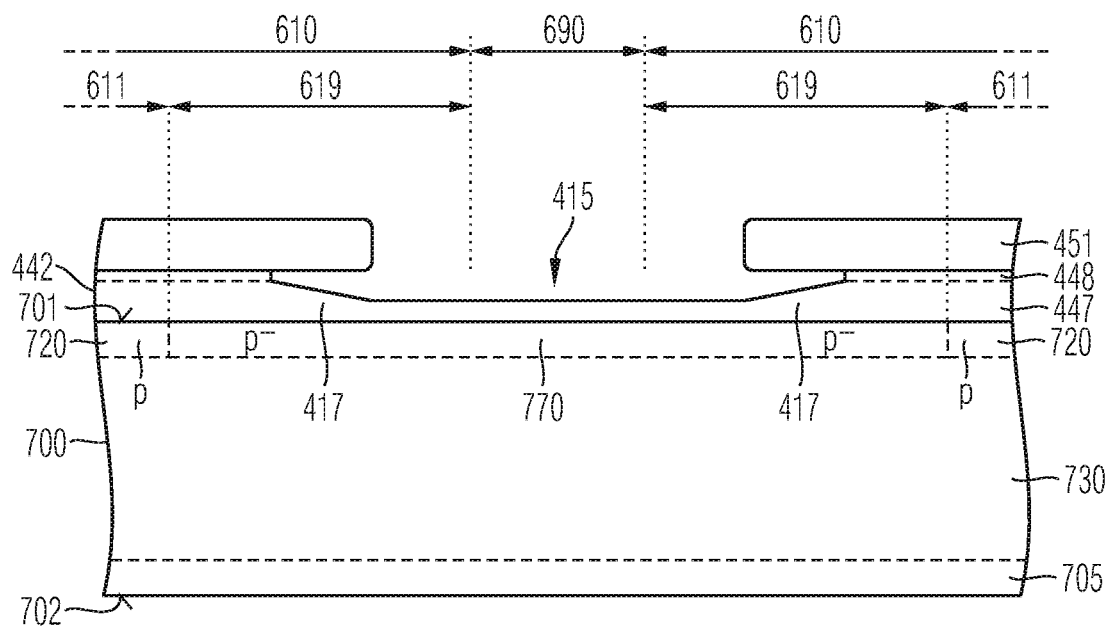
FIG. 14B is a schematic vertical cross-sectional view of the semiconductor substrate portion of FIG. 14A during an isotropic etch undercutting the support mask.

FIGS. 14A to 14B relate to a method forming a suitable etch mask for tapering junction termination zones on the basis of a multi-layer etch mask. A doped region 770 may be formed in a semiconductor substrate 700 as described with reference to FIG. 12A.

A multi-layer stack 440 including at least a mask base layer 447 and a mask top layer 448 is formed on the substrate surface 701. The mask base layer 447 and the mask top layer 448 may be formed from materials with different etching properties.

According to an embodiment, a starting layer, for example, a silicon oxide is deposited and impurities, for example, boron or phosphorous atoms, are implanted into a top section of starting layer, wherein the top section forms the mask top layer 448 and the unmodified section of the starting layer forms the mask base layer 447. A support mask layer is deposited and patterned by photolithography to form a support mask 451 covering the central areas 611 of the device regions 610 and including support mask openings 455 above the kerf region 690 and above edge sections 6192 of the termination areas 619 directly adjoining the kerf region 690.

FIG. 14A shows the support mask 451 on the multi-layer stack 440, wherein the support mask 451 covers portions of the multi-layer stack 440 in the vertical projection of the central areas 611 of the device regions 610 and wherein the support mask 451 includes support mask openings 455 directly above the kerf region 690 and directly above adjoining edge sections 6192 of the termination areas 619.

A wet etch that recesses the mask top layer 448 at a higher rate than the mask base layer 447 forms etch mask openings 415 in the vertical projection of the support mask openings 455.

FIG. 14B shows the effect of the wet etch. Due to the higher etch rate of the mask top layer 448, the wet etch undercuts the support mask 451 at a higher rate than the wet etch recesses the mask base layer 447. The wet etch gradually exposes an upper edge of the mask base layer 447 below the support mask 451. At the end of the wet etch, remnant portions of the mask base layer 447 and the mask top layer 448 form an etch mask with wedge-shaped tapering mask sections 417.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a drift zone formed in a semiconductor portion that comprises a transition section in which a vertical extension of the semiconductor portion decreases from a first vertical extension to a second vertical extension; and
a junction termination zone of a conductivity type complementary to a conductivity type of the drift zone,
wherein the junction termination zone is between a first surface of the semiconductor portion and the drift zone and comprises a tapering portion in the transition section,
wherein in the tapering portion a vertical extension of the junction termination zone decreases from a maximum vertical extension to zero within a lateral width of at least twice the maximum vertical extension.

2. The semiconductor device of claim 1, wherein the junction termination zone forms a planar first pn junction with a drift structure comprising the drift zone.

3. The semiconductor device of claim 1, wherein the junction termination zone forms a first pn junction with the drift zone.

4. The semiconductor device of claim 1, wherein the transition section is formed within a termination area between a central area and a side surface of the semiconductor portion, and wherein the central area comprises transistor cells or an anode region in electric contact with a first load electrode.

5. The semiconductor device of claim 4, wherein the vertical extension of the junction termination zone decreases with increasing distance to the central area.

6. The semiconductor device of claim 4, wherein the transition section surrounds the central area.

7. The semiconductor device of claim 1, wherein the semiconductor portion comprises a central area with the first vertical extension and a termination area that comprises the transition section and an edge section with the second vertical extension, and wherein the edge section is between the transition section and a side surface of the semiconductor portion.

8. The semiconductor device of claim 7, wherein a lateral distance between the junction termination zone and the side surface is at least as large as a thickness of a drift zone formed in the drift structure.

9. The semiconductor device of claim 1, wherein the junction termination zone laterally adjoins and surrounds an anode/body region forming a main pn junction with the drift structure.

10. The semiconductor device of claim 1, wherein the vertical extension of the junction termination zone decreases monotonically.

11. The semiconductor device of claim 1, wherein the vertical extension of the junction termination zone decreases linearly.

12. The semiconductor device of claim 1, wherein a lateral width of the transition section is equal to a lateral width of the tapering portion of the junction termination zone.

13. The semiconductor device of claim 1, wherein a lateral width of the transition section is greater than a lateral width of the tapering portion of the junction termination zone.

14. The semiconductor device of claim 1, further comprising:
a field ring comprising a field ring region protruding from a first surface of the semiconductor portion between the junction termination zone and a side surface of the semiconductor portion,
wherein the field ring region forms a second pn junction with the drift structure.

15. The semiconductor device of claim 1, wherein the semiconductor portion comprises silicon carbide.

16. A semiconductor device, comprising:
a drift zone formed in a semiconductor portion that comprises a central area with a first vertical extension and a termination area, the termination area comprising an edge section with a second vertical extension and a transition section in which the vertical extension gradually decreases from the first vertical extension to the second vertical extension; and
a junction termination zone between a first surface of the semiconductor portion and the drift zone, the junction termination zone having a conductivity type complementary to a conductivity type of the drift zone and comprising a tapering portion in the transition section,
wherein in the tapering portion a vertical extension of the junction termination zone gradually decreases from a maximum vertical extension to zero within a lateral distance of at least twice the maximum vertical extension.

* * * * *